(12) United States Patent
Koenig

(10) Patent No.: US 6,516,433 B1
(45) Date of Patent: Feb. 4, 2003

(54) METHOD FOR FINDING THE ROOT CAUSE OF THE FAILURE OF A FAULTY CHIP

(75) Inventor: Gregor Koenig, Hsinchu (TW)

(73) Assignees: Promos Technologies Inc., Hsinchu (TW); Mosel Vitelic, Inc., Hsinchu (TW)

(*) Notice: Subject to any disclaimer, the term of this patent is extended or adjusted under 35 U.S.C. 154(b) by 0 days.

(21) Appl. No.: 09/575,572

(22) Filed: May 22, 2000

(30) Foreign Application Priority Data

Mar. 3, 2000 (TW) .................................... 89103790 A

(51) Int. Cl.[7] ............................................... G01R 31/28
(52) U.S. Cl. ........................................ 714/737; 714/736
(58) Field of Search ................................ 364/578, 488; 716/21; 714/724, 737; 702/84

(56) References Cited

U.S. PATENT DOCUMENTS

| | | | | |
|---|---|---|---|---|
| 5,777,901 A | * | 7/1998 | Berezin et al. | 364/578 |
| 5,822,218 A | * | 10/1998 | Moosa et al. | 364/488 |
| 6,096,093 A | * | 8/2000 | Caywood et al. | 716/21 |
| 6,202,181 B1 | * | 3/2001 | Ferguson et al. | 714/724 |
| 6,324,481 B1 | * | 11/2001 | Atchison et al. | 702/84 |

* cited by examiner

Primary Examiner—David Ton
(74) Attorney, Agent, or Firm—Darby & Darby

(57) ABSTRACT

A method for finding the root causes of the failure of a faulty chip. The faulty chip comprises at least one defect. First, a type-searching step for the defect according to a defect size and a defect type to respectively predict a failure type of a predicted failure region relative to the defect is performed. Then, an influenced-range-searching step for the defect according to a defect location to respectively predict a failure range of a predicted failure region relative to the defect is performed. Finally, the predicted failure region of the defect and a real failure region which was electronically failed and been identified by the faulty chip are compared. If the predicted failure generated from the defect is located in the real failure region, the defect is interpreted to be one of the root causes of the failure of the faulty chip.

2 Claims, 3 Drawing Sheets

METHOD FOR FINDING THE ROOT CAUSE OF THE FAILURE OF A FAULTY CHIP

BACKGROUND OF THE INVENTION

1. Field of the Invention

The present invention generally relates to a method for finding the root causes of the failure of a faulty chip by computer. More specifically, the present invention relates to a method for finding the contribution that the defects on the faulty chip make to the failure of the faulty chip.

2. Description of the Related Art

The purpose of semiconductor processes is to form several chips with electrical functions on a semiconductor wafer. Thus, during fabrication, the semiconductor wafer has several repetitive patterns formed on its surface, each repetitive pattern being a chip. However, inevitably, some unwanted event occurs making some parts of a chip dissimilar with the same places of the other chips. These places with dissimilar patterns are called defects. For example, if one of the operators in the product line touches the surface of the semiconductor wafer, he causes a scratch defect on the surface. If a particle is dropped on the surface of the semiconductor wafer, it become a hard mask preventing the material below from being etched during a subsequent etch process, thus causing a particle defect. Since the defects usually have associated error functions and result in a faulty chip, the yield rate of a production line is decreased. Thus, decreasing defects is very important goal for a semiconductor factory.

However, not all the defects will decrease the yield rate. For example, if a defect has a very small size or is located somewhere unimportant, the chip with this defect may function as well as a chip without this defect. Thus, to improve the yield rate, it is very important to identify which defects contribute to the failure of a faulty chip. Then, engineers will know what kinds of defects decrease the yield rate and take some action to address them. Thus, discovering the relationship between defects and the failure of the chip is the first step to increase the yield rate by removing significant defects.

In order to discover the defects that result in a faulty chip, the method according to the prior art employs computer to compare the location of each defect with each of the regions that are electrically failed on the faulty chip. Only if the location of a defect is within one of the failed regions will the defect be recognized as one of the root causes of the faulty chip. For example, a memory chip can provide a bit map after testing. A bit map marks the memory cells that are electrically failed and points out their locations. Defects are found by scanning during the process flow. Depending on the scanning between different process steps, many defect maps can be obtained to express the defects on the semiconductor wafer. For example, the defect map of metal 1 (M1) layer means the defect map obtained by scanning after the pattern definition of M1 layer. To find out which defects in the defect map of M1 layer result in a faulty chip, the prior art makes the defect map of M1 layer overlay with the bit map of the faulty chip. Only if a defect is located at the location of an electrically failed bit is it recognized as a root cause of the failure of the faulty chip. This is called "hitting". However, the hitting rate for the bit map, being defined as the number of the faulty chips hit divided by the total number of the faulty chips, is as low as 10% in actual practice.

Not all defects affect the function of the regions in which they are located. For example, a memory chip usually comprises a memory array region and a periphery region. The memory array has a large amount of memory cells. The periphery region has the drivers for driving the memory cells in the memory array region. Suppose one defect is located in the region of one driver and causes the driver to fail. In this case, the memory cells that the driver drives also fail. It is obvious that this defect is one of the root causes of the faulty chip. However, the prior art can't provide a way to discover the relationship between the failure of the faulty chip and the defect because the regions of the failed memories don't include the location of the defect. Thus, the prior art can't provide sufficient information for engineers to take proper actions.

SUMMARY OF THE INVENTION

Therefore, an object of the present invention is to provide a method for finding the root causes of a faulty chip. The method of the present invention can find more defects that cause a faulty chip than that of the prior art.

Another object of the present invention is to provide useful information for engineers to improve the yield rate of a product line.

The present invention achieves the above-indicated objects by providing a method for finding the root causes of the failure of a faulty chip. The faulty chip is fabricated by a plurality of processes. The faulty chip comprises at least one defect detected after one of the processes. The defect is characterized by at least one characteristic. The faulty chip is tested to identify at least one real failure region that is electrically failed. The method can be performed by a computer. First, the method performs a defect-to-failure matching step according to the characteristic of each defect to respectively generate a predicted failure region that is predicted to be electrically failed due to the defect. Second, the present invention compares the predicted failure region of each defect with the real failure region. If the predicted failure generated from the defect is located in the real failure region, then the defect is interpreted as one of the root causes of the failure of the faulty chip.

The present invention further provides another method for finding the root causes of the failure of a faulty chip. The faulty chip is fabricated by a plurality of processes. The faulty chip comprises at least one defect that is detected after one of the processes. The defect is characterized by at least one characteristic. The faulty chip is tested to identify at least one real failure region that is electrically failed. The method can be performed by a computer and comprises the following steps. First, the method performs a pattern-recognizing step to characterize the real failure region by a failure range and a failure type. Second, the method performs a failure-to-defect matching step to generate at least one predicted characteristic range according to the failure range and the failure type of the real failure region. Third, the method compares the characteristic of the defect with the predicted characteristic range. If the characteristic of the defect is within the predicted characteristic range, then the defect is interpreted as one of the root causes of the failure of the faulty chip.

In the preferred embodiment, the characteristic of the defect comprises a defect location, a defect size and a defect type. The predicted characteristic range comprises a predicted defect region, a predicted defect size range and a predicted defect type.

The advantage of the method of the present invention is its ability to find more defects that affect the function of the faulty chip than the method of the prior art since the present invention simultaneously considers the defect size, the defect location and the defect type. Thus, the present invention provides useful information for engineers to improve the yield rate of a product line.

BRIEF DESCRIPTION OF THE DRAWINGS

The following detailed description, given by way of examples and not intended to limit the invention solely to the embodiments described herein, will best be understood in conjunction with the accompanying drawings, in which.

DETAILED DESCRIPTION OF THE PREFERRED EMBODIMENTS

The present invention provides a method for finding the root causes of the failure of a faulty chip by computer. For convenience, a memory chip that has failed during testing is taken as an example of a faulty chip.

Figure 1:
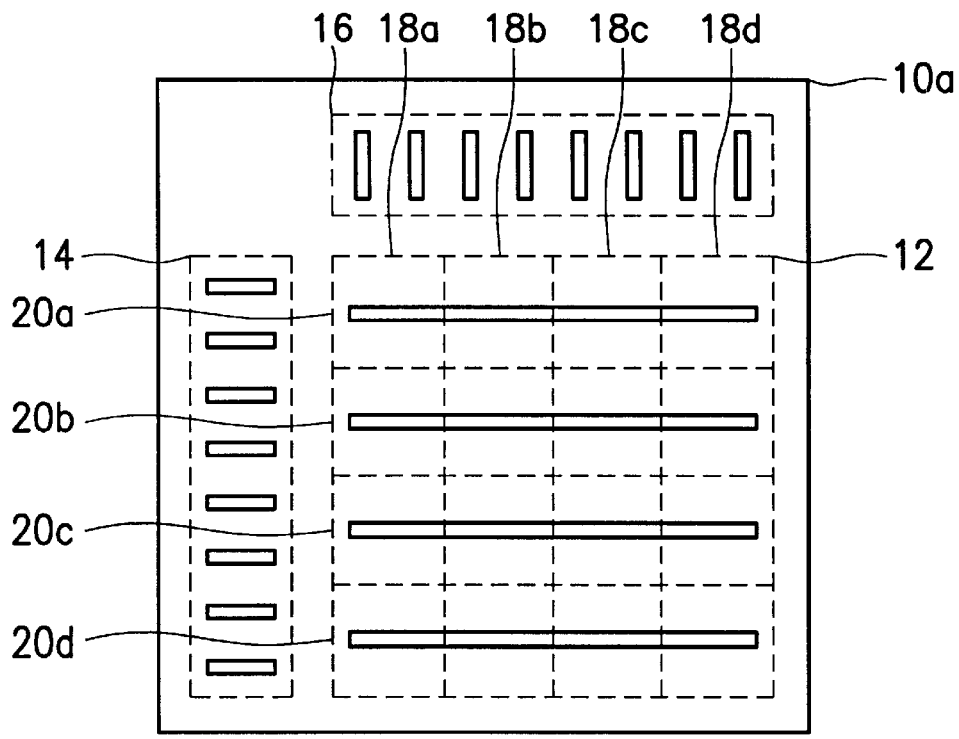
FIG. 1 is a mask diagram for defining a poly-silicon layer of a faulty chip according to the present invention.
Figure 2:
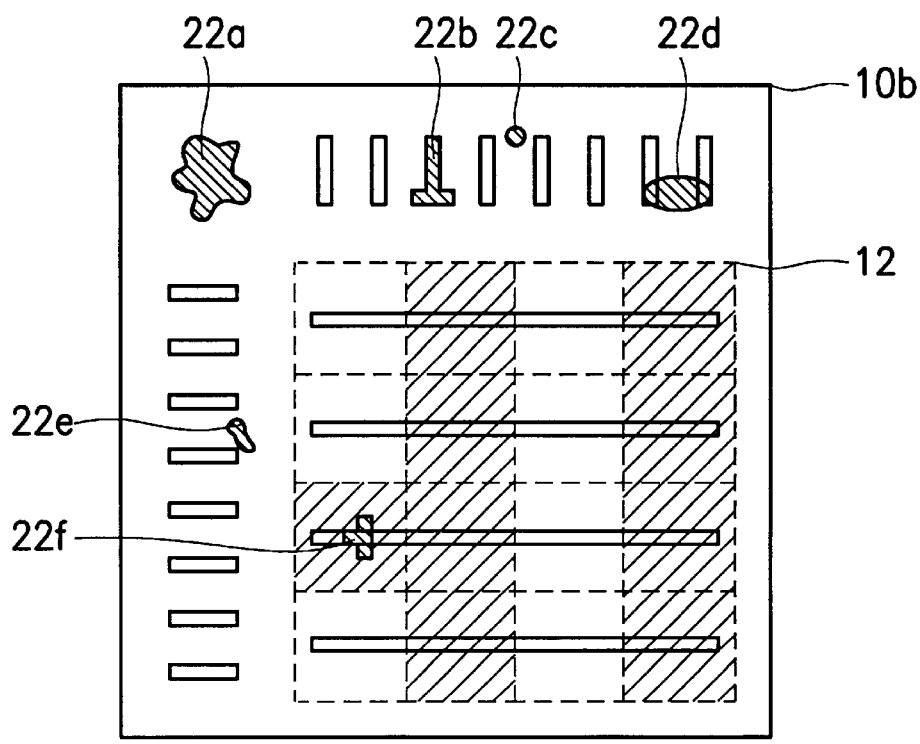
FIG. 2 is a diagram of defects and the real failure regions on a faulty chip according to the present invention.

FIG. 1 is a mask diagram defining a poly-silicon layer of a faulty chip according to the present invention. FIG. 2 is a diagram of defects and the real failure regions on a faulty chip. A faulty chip 10b is fabricated by a plurality of processes. For example, the processes comprise lithography processes, etch processes and oxidation processes, etc. Generally, to determine the process step in which a defect occurred, a scanning process should be added after the definition of a layer, or after the photo-resist stripping process. After comparing the pattern of each chip, defects of a layer can be found. Conventionally, a mask has an ID number and the defects of an ID number means the defect was generated while defining the pattern with the mask of that ID number. For example, a defect of 130 means that this defect occurred while patterning the polysilicon layer with the mask of 130. FIG. 1 is a diagram of the mask of 130 for patterning a poly-silicon layer. The mask 10a of 130 defines a memory array region 12, x decoder region 14 and y decoder region 16, etc. The memory array region 12 has a plurality of horizontal word lines for forming a plurality of memory cells. The columns of the memory array region 12 are represented as 20a~20d, the rows of the memory array region 12 are represented as 18a~18d, and the memory cell at the top-left corner is represented as (18a, 20b), for example. The x decoder region 14 and the y decoder region 16 are used to place the drivers for driving memory cells in the memory array region 12. Thus, there are small pieces of poly-silicon formed in the x decoder region 14 and the y decoder region 16 acting as the gates of MOSs or the interconnections.

Scanning after the definition of the poly-silicon layer, the defects 22a~22f of the faulty chip (the defects of 130) can be detected, as shown in FIG. 2. Each defect is characterized by at least one characteristic. In this embodiment, such characteristics comprise a defect location, a defect size and a defect type. For example, the defect location is the coordinates of the defects, the defect size is a rough size of the defect, and the defect type is the original source or the shape of the defect. This defect data can be identified and recorded by the operators in the product line or by a scanning tool with a pattern-recognizing function. Finally, these data are saved in a computer.

During the functional testing processes, at least one real failure region that is electrically failed can be identified on the faulty chip 10b. For example, a testing tool finds the memory cells of column 22b and column 22d in the memory array region 12 are all failed. Besides, the memory cell of (18a, 20c) is failed, too. All these failed memory cells are represented by squares with diagonal lines and defined as a real failure region(s), as shown in FIG. 2.

Figure 3:
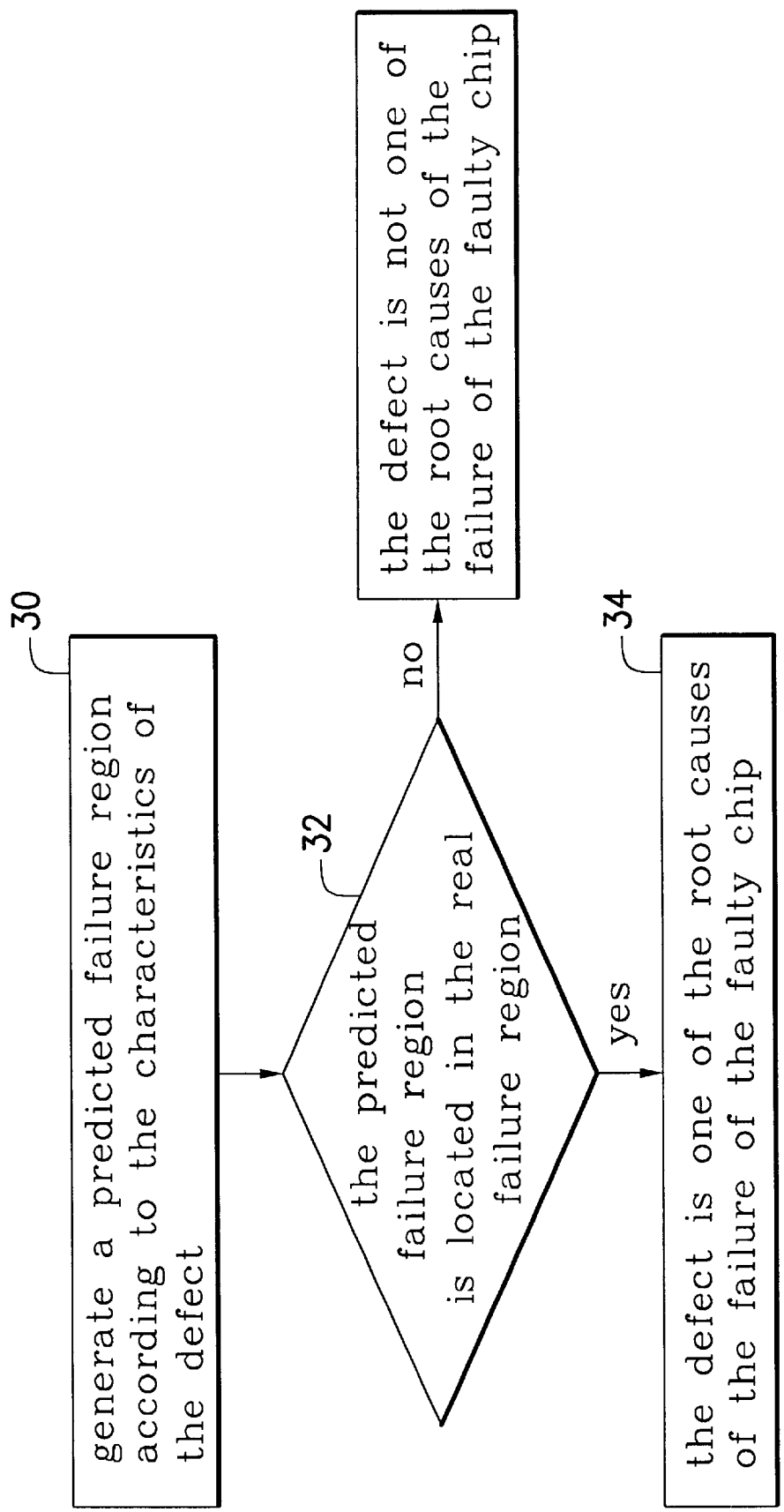
FIG. 3 is a first embodiment of the present invention.

FIG. 3 is a first embodiment of the present invention. The first embodiment traces the possible paths from the defects to the real failure regions for finding the defects that really cause the failure of the faulty chip. The paragraph herein-after focuses on handling one of the defects. However, the present invention can be applied to all the defects. The first embodiment performs a defect-to-failure matching step according to the defect location, the defect size, and the defect type to respectively generate at least a predicted failure region that is predicted to be electrically failed due to the defect 30. The first embodiment then compares the predicted failure region of the defect with the real failure region. If the predicted failure generated from the defect is located within the real failure region 32, then the defect is one of the root causes of the failure of the faulty chip 34. For example, a matching table or a logic rule for defining the predicted region(s) predicted by each defect type, defect size and defect location is entered into a computer according to the masks and the experience of the engineers. Defect 22a in FIG. 2, for instance, has a defect size of 0.5 um, a defect type of particle and a defect location inside a field oxide region. However, a defect inside a field oxide region usually doesn't damage the electrical functions of a chip. Thus, the predicted failure region predicted by the defect 22a is an empty region, and the defect 22a will not be a root cause of the failure of the faulty chip. The defect 22d in FIG. 2, on the other hand, has a defect size of 0.3 um, a defect type of bridge and a defect location inside the y decoder region 16. From the predetermined matching table or the logic rule, defect 22d has the possibility to cause the memory cells in column 18d to fail, thus the predicted failure region is the region in which the memory cells in column 18d are located. In this case, the real failure region(s) includes the memory cells in column 18d, and thus this event is called a "hit", and the defect 22d is a root cause of the failure of the faulty chip.

After comparing the predicted failure region(s) generated by each defect with the real failure region(s) one by one and searching for "hits", the computer can find the defects that really contribute to the failure of the faulty chip. In view of the whole semiconductor wafer, this method can statistically determine how much the yield rate suffered because of the defects of a layer.

A pattern recognizer can process the real failure region(s) in advance to define the failure type and the failure range of the real failure region(s). The defect-to-failure matching step can respectively execute the matching in consideration of the failure type and the failure range of the real failure region(s) For example, the defect-to-failure matching step performs a type-searching step for each of the defects according to the defect size and the defect type to predict the failure type of the predicted failure region relative to the defect. If a defect has a defect size smaller than 0.1 um and the defect type of particle, for instance, this defect should be simply ignored and the next defect processed. After the type-searching step, the defect-to-failure matching step performs an influenced-range-searching step for each of the defects according to the defect location to predict the failure range that the predicted failure region relative to the defect. If and only if the predicted failure type is the same as the real failure type, and the predicted failure region is within the real failure region is the defect one of the root causes of the failure of the faulty chip.

Figure 4:
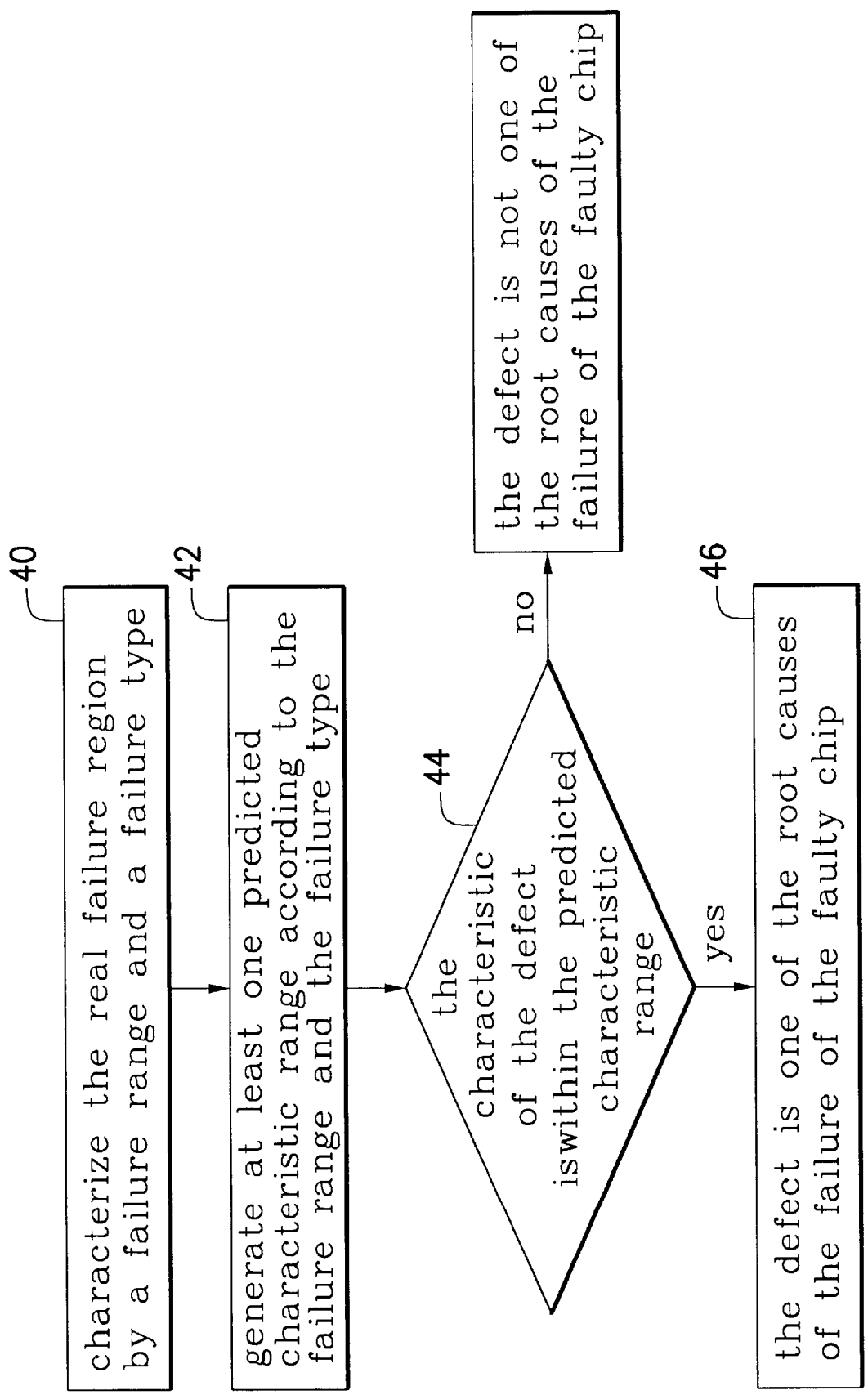
FIG. 4 is a second embodiment of the present invention.

FIG. 4 is a second embodiment of the present invention. The second embodiment traces the possible paths from the real failure region(s) to the defects for finding the defects that really cause the failure of the faulty chip. First, the second embodiment performs a pattern-recognizing step by a pattern recognizer to characterize the real failure region by a failure range and a failure type 40. Second, the second embodiment performs a failure-to-defect matching step to generate at least one predicted characteristic range according to the failure range and the failure type of the real failure region 42. For example, in this embodiment, the predicted characteristic ranges comprise one predicted defect region, one predicted defect size range and one predicted defect type. Third, the second embodiment compares the defect location, the defect size and the defect type of each defect with the predicted defect region, the predicted defect size range and the predicted defect type, respectively. If the characteristics of the defect are within the predicted characteristic ranges, then the defect is interpreted to be one of the root causes of the failure of the faulty chip. That is, if the defect location and the defect size of a defect are within the predicted defect region and the predicted defect size range respectively, and the defect type of the defect is the same as the predicted defect type 44, then the defect is one of the root causes of the failure of the faulty chip 46, as shown in FIG. 4. For example, after performing the pattern-recognizing step, the pattern recognizer separates the real failure region (s) into three specific regions. One specific region has the failure type of single cell failure and the failure range of (18a, 20c). The failure types of the others are column failure, and the failure ranges of these two specific regions are column 18b and column 18d, respectively.

A matching table or a logic rule can define how a real failure region relates to a predicted defect region on the faulty chip, a predicted defect size range and a predicted defect type. For example, after checking the matching table or the logic rule, it may be determined that a real failure region with the failure type of single cell failure should result from the defects fitting the following conditions. First, they should be located inside the region of the failed cell, namely the cell (18a, 20c). Second, they have the defect size between 0.3 and 0.5 um. Third, they can have any defect type. Defect 22f fits all these three conditions, therefor defect 22f is a root cause of the failure of the faulty chip. Following the same method as mentioned above, one should find the predicted defect region, the predicted defect size range and the predicted defect type for the specific region of column 18d in layer 130. In this case, the predicted defect region is part of the y decoder region 16 in which the driver(s) for the memories in column 18d are located, the predicted defect size range is 0.5 to 0.8 um, and the predicted defect type is bridge or blocked etch. Defect 22d, whose defect type, defect size and defect location are bridge, 0.6 um and in the y decoder 16, fits all the predicted conditions. Thus, defect 22d is one of the root causes of the failure of the faulty chip.

The feature of the present invention is to build up the relationship between the defects and the real failure region according to the defect size, the defect location and the defect type. Thus, the present invention can find the defects that contribute to the failure of the faulty chip. Even if a defect is not located in a real failure region, the present method can find whether the defect affects the function of the faulty chip. Therefor, the present invention can improve the hitting rate, which is defined as the number of the faulty chips hit divided by the total number of the faulty chips. Applying the present invention to the defects of each layer in a process flow identifies which layer generates defects that have the greatest negative impact on the yield rate. Thus, the engineers can focus on the identified process step to remove the defects and improve the yield rate.

The faulty chip can be a memory chip. It can also be an imbedded-memory chip or a logic chip. The method of the present invention can be applied to any chip for which real failure regions can be identified by testing the electrical functions in their input/output ports.

Although the embodiments of the present invention employ 3 characteristics to character the defects, in practice any number of characteristics can be employed to implement the concept of the present invention. The key point is to use the relation between the defect and the failure region to find the root cause of the faulty chip.

The present invention and the prior art both consider the influences of the defect location. The present invention further considers the influences of the defect size and the defect type. Thus, the method of the present invention can find more defects that affect the function of the faulty chip than the prior art and provides useful information for engineers to improve the yield rate of a product line.

While the invention has been described by way of examples and in terms of the preferred embodiments, it is to be understood that the invention is not limited to the embodiments disclosed. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A method for locating root causes of a failure of a faulty chip, the faulty chip being fabricated by a plurality of processes, the faulty chip comprising at least one defect which is detected after one of the plurality of processes, the at least one defect being at least one of a defect location, a defect size and a defect type, the faulty chip being tested to identify at least one real region which electronically failed, the method comprising the steps of:

performing defect-to-failure matching based on characteristics of the defect to generate a predicted failure region that is likely to have electronically failed due to the defect;

influenced-range-searching for the defect based on the defect location to respectively predict the failure range of the predicted failure region relative to the defect; and comparing the predicted failure region of the at least one defect with the real region which electronically failed;

wherein, if the predicted failure generated from the defect is located in the at least one real region which electronically failed, then the defect is one of the root causes of the failure of the faulty chip;

the at least one real region which electronically failed being a failure type and a failure range, and the defect-to-failure matching step comprises type-searching for the defect based on the defect size and the defect type to respectively predict the failure type of the predicted failure region relative to the defect.

2. The method of claim 1, wherein, if and only if the predicted failure type is the same as the at least one real region which electronically failed, and the predicted failure region is within the at least one real failure region which electronically failed, then the defect is one of the root causes of the failure of the faulty chip.

* * * * *